United States Patent
Wakasugi

(10) Patent No.: US 11,114,317 B2
(45) Date of Patent: Sep. 7, 2021

(54) METHOD FOR CLEANING SEMICONDUCTOR WAFER AND MANUFACTURING METHOD OF SEMICONDUCTOR WAFER USING THE METHOD FOR CLEANING

(71) Applicant: SUMCO CORPORATION, Tokyo (JP)

(72) Inventor: Katsuro Wakasugi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 12 days.

(21) Appl. No.: 16/441,636

(22) Filed: Jun. 14, 2019

(65) Prior Publication Data

US 2020/0020552 A1 Jan. 16, 2020

(30) Foreign Application Priority Data

Jul. 11, 2018 (JP) .............................. JP2018-131759

(51) Int. Cl.
*H01L 21/67* (2006.01)
*H01L 21/02* (2006.01)

(52) U.S. Cl.
CPC .... *H01L 21/67057* (2013.01); *H01L 21/0206* (2013.01); *H01L 21/67051* (2013.01)

(58) Field of Classification Search
None
See application file for complete search history.

(56) References Cited

U.S. PATENT DOCUMENTS

| 6,982,006 B1* | 1/2006 | Boyers | A61L 2/183 |
| | | | 134/1 |
| 2011/0183113 A1* | 7/2011 | Sakaguchi | B24B 37/04 |
| | | | 428/143 |

FOREIGN PATENT DOCUMENTS

| JP | 2000-24604 A | 1/2000 |
| JP | 2000-126702 A | 5/2000 |
| JP | 2004-193534 A | 7/2004 |

OTHER PUBLICATIONS

Espacenet translation of JP2000024604, retrieved on Sep. 14, 2020 (Year: 2020).*
Office Action for JP App. No. 2018-131759, dated May 18, 2021 (w/ translation).

* cited by examiner

*Primary Examiner* — Eric W Golightly
(74) *Attorney, Agent, or Firm* — Greenblum & Bernstein, P.L.C.

(57) ABSTRACT

Provided is a method for cleaning a semiconductor wafer which can effectively reduce deposits on a main surface of a wafer. A method for cleaning a semiconductor wafer of the present disclosure includes supplying ozone water into a cleaning tank from a lower part of the cleaning tank with the ozone water overflowing from the upper part of the cleaning tank to outside the cleaning tank (first step), subsequently, stopping a supply of the ozone water (second step), subsequently, immersing a semiconductor wafer into the ozone water in the cleaning tank (third step), and subsequently, resupplying the ozone water into the cleaning tank from the lower part of the cleaning tank with the ozone water overflowing again from the upper part of the cleaning tank to outside the cleaning tank (fourth step).

10 Claims, 2 Drawing Sheets the first step the second step the third step the fourth step

RELATED ART

METHOD FOR CLEANING SEMICONDUCTOR WAFER AND MANUFACTURING METHOD OF SEMICONDUCTOR WAFER USING THE METHOD FOR CLEANING

TECHNICAL FIELD

This disclosure relates to a method for cleaning a semiconductor wafer and a manufacturing method of the semiconductor wafer using the method for cleaning.

BACKGROUND

In the cleaning of a semiconductor wafer, contaminants such as organic material adhering to the semiconductor wafer are removed by immersing the semiconductor wafer in a cleaning tank where ozone water is stored. Further, in the cleaning of a semiconductor wafer, generally, after forming an oxide film on the wafer surface by immersing and oxidizing the semiconductor wafer in the ozone water, the removal of the particles is performed simultaneously with the removal of this oxide film by immersing the semiconductor wafer in hydrofluoric acid.

JP2000-24604A (PTL 1) discloses a method which uses a cleaning device for supplying the ozone water into a cleaning tank from the lower part of the cleaning tank while overflowing the ozone water from the upper part of the cleaning tank to outside of the cleaning tank to clean the semiconductor wafer. Namely, in PTL 1, a semiconductor wafer is immersed into the ozone water in the cleaning tank with the ozone water overflowing, and the semiconductor wafer is cleaned by the rising flow of the ozone water from the lower part of the cleaning tank toward the upper part.

CITATION LIST

Patent Literature

PTL 1: JP2000-24604A

SUMMARY

If ozone water is stored for a long period of time in a cleaning tank, the ozone contained in the ozone water decomposes, and accordingly, the ozone concentration decreases, thus, the detergency of the ozone water decreases. Accordingly, conventionally, in order to maintain the detergency of the ozone water, it was considered to be important to immerse and clean the semiconductor wafer in the ozone water in the cleaning tank with the ozone water overflowed as described in PTL 1. However, the inventor of the present disclosure discovered that when using the method of PTL 1 to clean the semiconductor wafer, a plurality of deposits remain along a constant direction on a main surface of the wafer after cleaning. These deposits firmly adhere to the main surface of the wafer, and then, it was not possible to sufficiently remove the deposits even if so-called SC-1 cleaning was performed, even if ozone cleaning and hydrofluoric acid cleaning were repeated, or even if a physical cleaning such as brush scrubbing was performed.

It is the object of the present disclosure, in view of the aforementioned problem, to provide a method for cleaning a semiconductor wafer which can effectively reduce deposits on the main surface of the wafer. Further, it is the object of the present disclosure to provide a manufacturing method of a semiconductor wafer which can obtain a semiconductor wafer in which deposits on the main surface of the wafer are effectively reduced.

The inventor of this disclosure examined the deposits on the main surface of the wafer by Light Point Defect (LPD) examination. Then, as illustrated in FIGS. 2A and B, the inventor discovered that these deposits exist along a direction opposite to the immersion direction of the semiconductor wafer. This direction corresponds to the direction of the rising flow of the ozone water in the cleaning tank. Further, the inventor analyzed the components of these deposits by Raman spectrometry, then resins such as polyvinyl alcohol were detected. Moreover, as the result of further examination, the inventor discovered the following.

A transfer arm or a transfer container such as a Front Opening Unified Pod (FOUP) can be used for the transfer between manufacturing steps of the semiconductor wafer prior to ozone cleaning. Specifically, an end surface of the wafer is held by a plurality of chuck pins provided in the transfer arm to handle the semiconductor wafer. Moreover, the semiconductor wafer is accommodated in the transfer container and transferred in a manner in which the end surface of the wafer is held in contact with a groove provided on the inner surface of the transfer container. At this time, a resin is generally used for the material of the chuck pin and the transfer container, thus, particles containing the resin adhere to the end surface of the wafer. Further, there is the possibility that the particles containing the resin also adhere to a back surface of the wafer. Therefore, the particles adhere to the end surface and the back surface of the semiconductor wafer prior to being subjected to ozone cleaning. Further, in a state where the oxide film has not formed, the surface of the semiconductor wafer prior to being subjected to ozone cleaning is an active surface (hydrophobic surface) on which an element such as silicon used as a wafer material is exposed, thus, the particles are likely to attach firmly. When a semiconductor wafer in such a state is immersed in ozone water in which a rising flow has been produced, the particles separated from the end surface and the back surface of the wafer and the resin components of which particles which adhered to the end surface and the back surface of the wafer were dissolved and finely separated diffuse with the rising flow of the ozone water and adhere again to the main surface of the wafer. Due to this, a plurality of deposits remain on the main surface of the wafer after cleaning along the direction of the rising flow of the ozone water.

Therefore, the inventor examined a cleaning method for effectively reducing the deposits on the main surface of the wafer, and discovered that the deposits on the main surface of the wafer could be effectively reduced if the semiconductor wafer was immersed into the ozone water in the cleaning tank in a state in which the rising flow of the ozone water was suppressed.

The present disclosure has been completed based on the knowledge described above and the primary features of the present disclosure are as follows.

(1) A method for cleaning a semiconductor wafer in which the semiconductor wafer is immersed and cleaned in ozone water in a cleaning tank, the method comprising:
supplying the ozone water into the cleaning tank from a lower part of the cleaning tank with the ozone water overflowing from an upper part of the cleaning tank to outside of the cleaning tank:
subsequently, stopping a supply of the ozone water;
subsequently, immersing the semiconductor wafer into the ozone water in the cleaning tank; and subsequently, resupplying the ozone water into the cleaning tank from the lower part of the cleaning tank with the ozone water overflowing again from the upper part of the cleaning tank to the outside of the cleaning tank.

(2) The method for cleaning the semiconductor wafer according to the aforementioned (1), wherein a period of time from when the supply of the ozone water is stopped until the ozone water is resupplied is set to 1 second or more to 30 seconds or less.

(3) The method for cleaning the semiconductor wafer according to the aforementioned (2), wherein a period of time from when the supply of the ozone water is stopped until a lower end of the semiconductor wafer contacts a liquid surface of the ozone water is set to 1 second or more to 10 seconds or less.

(4) The method for cleaning the semiconductor wafer according to the aforementioned (2), wherein a period of time from when the entirety of the semiconductor wafer is immersed into the ozone water until the ozone water is resupplied is set to 1 second or more to 10 seconds or less.

(5) The method for cleaning the semiconductor wafer according to the aforementioned (1), wherein prior to cleaning, the semiconductor wafer is subjected to an epitaxial growth process.

(6) The method for cleaning the semiconductor wafer according to the aforementioned (1), wherein prior to cleaning, the semiconductor wafer is subjected to an annealing process in a reducing atmosphere or an inert gas atmosphere.

(7) The method for cleaning the semiconductor wafer according to the aforementioned (1), wherein the semiconductor wafer is a silicon wafer.

(8) A manufacturing method of the semiconductor wafer using the method for cleaning the semiconductor wafer according to the aforementioned (1) in a step for manufacturing the semiconductor wafer.

According to the present disclosure, it is possible to effectively reduce deposits on the main surface of the wafer.

DETAILED DESCRIPTION

Figure 1A:
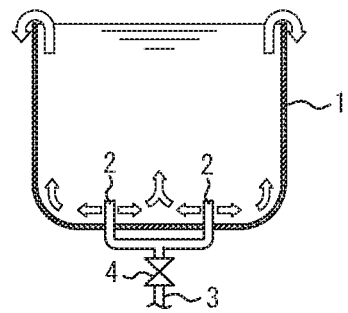
FIGS. 1A to 1D are diagrams describing a method for cleaning a semiconductor wafer according to an embodiment of this disclosure.

Hereinafter, embodiments of the present disclosure will be described in detail with reference to the drawings.

[Cleaning Device]

An example of the cleaning device for the semiconductor wafer which can be used in an embodiment of the present disclosure will be described with reference to FIG. 1A.

This cleaning device is comprised of a cleaning tank 1, a pair of ozone water supply nozzles 2, an ozone water supply pipe 3, and an ozone water generating unit.

The cleaning tank 1 is a substantially rectangular container which can accommodates a semiconductor wafer W, and the cleaning tank 1 has an opening at a top part of it. A pair of ozone water supply nozzles 2 is provided in the bottom part of the cleaning tank 1, and each of the ozone water supply nozzles 2 is oriented toward the upper part of the cleaning tank 1. The ozone water generating unit is connected to the ozone water supply pipe 3. The ozone water supply pipe 3 is branched in the middle of it, and is connected to the pair of ozone water supply nozzles 2. Further, a regulation valve 4 for regulating the flow rate of the ozone water to be supplied into the cleaning tank 1 is provided in the ozone water supply pipe 3. It should be noted that a known or arbitrary device can be suitably used as the ozone water generating unit. For example, an ozone water generating unit which generates ozone by electrolyzing pure water can be used.

In the cleaning device, the ozone water generated by the ozone water generating unit passes through the ozone water supply pipe 3 to be supplied from the pair of ozone water supply nozzles 2 into the cleaning tank 1. Moreover, when the cleaning tank 1 is filled with the ozone water, the ozone water overflows from the opening at the top part of the cleaning tank 1. Here, the arrow in FIG. 1A indicates the flow of the ozone water. It should be noted that the overflowed ozone water can be retrieved in a double tank provided around the outer wall of the cleaning tank 1, and can be reused. By overflowing the ozone water in this manner, it is possible to suppress the particles separated from the semiconductor wafer from circulating by convection within the cleaning tank 1 and re-adhering to the semiconductor wafer. Accordingly, the ozone water is usually made to be overflowed in the ozone cleaning of a semiconductor wafer.

Here, as long as the ozone water supply nozzle 2 is provided in the lower part of the cleaning tank 1 and is oriented toward the upper part of the cleaning tank 1, it is not always necessary to provide it at the bottom part of the cleaning tank 1. Further, the number of ozone water supply nozzles is not limited to two. For example, the ozone water supply nozzle may be provided in the lower part of the side of the cleaning tank 1.

[Method for Cleaning a Semiconductor Wafer]

Hereinafter, an embodiment of the method for cleaning the semiconductor wafer which can be used in the above-mentioned cleaning device will be described with reference to FIGS. 1A to 1D.

[First Step: Supply of the Ozone Water]

With reference to FIG. 1A, in the first step, the ozone water is supplied into the cleaning tank 1 from the lower part of the cleaning tank 1 while the ozone water overflows from the upper part of the cleaning tank 1 to outside the cleaning tank 1. The ozone water in the cleaning tank 1 is always replaced with new ozone water thereby, thus, the ozone concentration remains constant. At this time, a rising flow of the ozone water is produced in the cleaning tank 1 from the lower part toward the upper part of the cleaning tank 1.

For example, the first step can be performed as follows. First, the ozone water is generated by the ozone water generating unit. Subsequently, when the regulation valve 4 provided in the ozone water supply pipe 3 is opened, the ozone water passes through the ozone water supply pipe 3 to be supplied into the cleaning tank 1 from the pair of ozone water supply nozzles 2 provided in the bottom part of the cleaning tank 1. Moreover, when the cleaning tank 1 is filled with the ozone water, the ozone water overflows from the opening in the top part of the cleaning tank 1.

The ozone concentration of the ozone water is preferably set to 10 ppm or more on a mass basis. If the ozone concentration is 10 ppm or more, the detergency of the ozone water can be sufficiently maintained. It should be noted that from the viewpoint of forming an oxide film on the surface of the wafer the upper limit of the ozone concentration is preferably higher, but from the viewpoint of the productivity the ozone concentration is preferably set to 30 ppm or less.

The amount of the ozone water to be supplied from the ozone water supply nozzle 2 is preferably set to 30000 mm$^3$/sec or more. If the amount of the ozone water is 30000 mm$^3$/sec or more, the cleaning performance of the ozone water can be sufficiently maintained. It should be noted that from the viewpoint of the productivity the amount of the ozone water to be supplied is preferably set to 55000 mm$^3$/sec or less.

[Second Step: Stopping the Supply of Ozone Water]

Figure 1B:
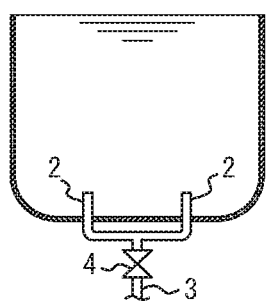

With reference to FIG. 1B, in the second step, the supply of ozone water to the cleaning tank 1 is stopped. The rising flow of the ozone water generated in the first step is suppressed thereby. The technical significance thereof will be described later. It should be noted that the second step may be performed by closing the regulation valve 4.

[Third Step: Immersion of Semiconductor Wafer]

Figure 1C:
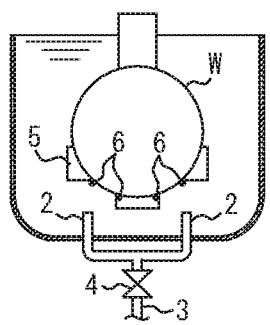

With reference to FIG. 1C, in the third step, the semiconductor wafer W is immersed into the ozone water in the cleaning tank 1.

For example, the third step can be performed by using a known or arbitrary transfer robot. Here, the transfer robot is comprised of a cross-shaped transfer arm 5 for transferring the semiconductor wafer W, and a movement mechanism for moving the transfer arm 5 in the horizontal and vertical directions. It should be noted that four chuck pins 6 holding the semiconductor wafer W are provided in the transfer arm 5. Moreover, the insertion of the semiconductor wafer W into the cleaning tank 1 can be performed as follows. First, the semiconductor wafer W is held by the chuck pins 6. Subsequently, after the semiconductor wafer W is moved onto the cleaning tank 1 by appropriately moving the transfer arm 5 using the movement mechanism, the semiconductor wafer W is lowered in regard to the cleaning tank 1. The semiconductor wafer W is immersed into the ozone water in the cleaning tank 1 thereby. It should be noted that the lowering speed of the semiconductor wafer W is not specifically limited, and may be appropriately set to a range of 30 to 200 mm/sec.

In the present embodiment, after stopping the supply of the ozone water to the cleaning tank 1 in the second step, it is important to immerse the semiconductor wafer W in the ozone water stored in the cleaning tank 1 in the third step. Below is discussed its technical significance.

Conventionally, a semiconductor wafer is immersed in ozone water in the cleaning tank and cleaned in a state in which the ozone water is supplied from the lower part of the cleaning tank while the ozone water overflows from the upper part of the cleaning tank. Namely, the semiconductor wafer is immersed into the ozone water in a state in which a rising flow is strongly produced from the lower part of the cleaning tank toward the upper part. Here, the particles adhere to an edge surface of the semiconductor wafer prior to being subjected to ozone cleaning due to the transfer between manufacturing steps of the wafer. Further, the particles may adhere to the back surface due to wafer processing. Further, in a state where the oxide film has not formed, the surface of the semiconductor wafer prior to being subjected to ozone cleaning is an active surface (hydrophobic surface) on which an element such as silicon used as a wafer material is exposed, thus, the particles are likely to attach firmly. When the semiconductor wafer in such a state is subjected to the above described conventional method for cleaning, the particles adhered to the end surface of the wafer are peeled off, diffuse with the rising flow of the ozone water, the particles wrap around the wafer main surface side, and re-adhere to the main surface of the wafer which is an active surface (hydrophobic surface).

In contrast, in the present embodiment, after stopping the supply of the ozone water to the cleaning tank 1 in the second step illustrated in FIG. 1B, the semiconductor wafer W is immersed into the ozone water in the cleaning tank 1 in the third step illustrated in FIG. 1C. Accordingly, when immersing the semiconductor wafer W in the ozone water in the cleaning tank 1, the rising flow of the ozone water is suppressed. By immersing the semiconductor wafer W in such a state, the semiconductor wafer W moves along with the ozone water to the lower part of the cleaning tank 1. Thus, even if the particles on the end surface and the back surface of the wafer are separated, the particles are unlikely to wrap around the wafer main surface side. In short, even if the particles separate from the end surface of the wafer, the separated particles are suppressed from diffusing with the rising flow of the ozone water. As a result, the deposits on the main surface of the wafer can be effectively reduced.

The period of time from when the supply of the ozone water is stopped in the second step illustrated in FIG. 1B, until the lower end of the semiconductor wafer W contacts the liquid surface of the ozone water filled within the cleaning tank 1 in the third step illustrated in FIG. 1C is preferably set to 1 second or more to 10 seconds or less. If the period of time is 1 second or more, the rising flow of the ozone water can be sufficiently suppressed. If the period of time is 10 seconds or less, even if the supply of the ozone water is stopped, the decomposition of the ozone contained in the ozone water does not occur to a great extent, thus, the detergency of the ozone water can be sufficiently maintained. More preferably, this period of time is set to 1 second or more to 5 seconds or less.

[Fourth Step: Resupplying of the Ozone Water]

Figure 1D:
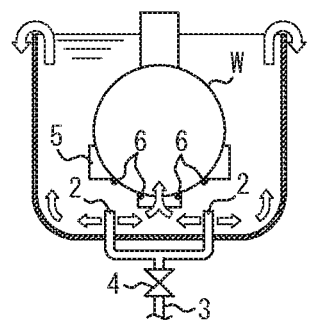
Figure 2A:
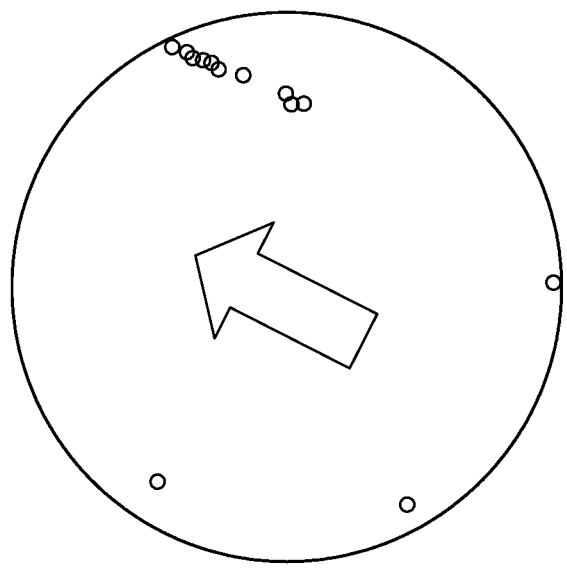
FIG. 2A is an LPD map of the wafer surface after cleaning in the case when using a conventional method for cleaning the semiconductor wafer, and the arrow in the drawing illustrates an immersion direction of the semiconductor wafer.
Figure 2B:
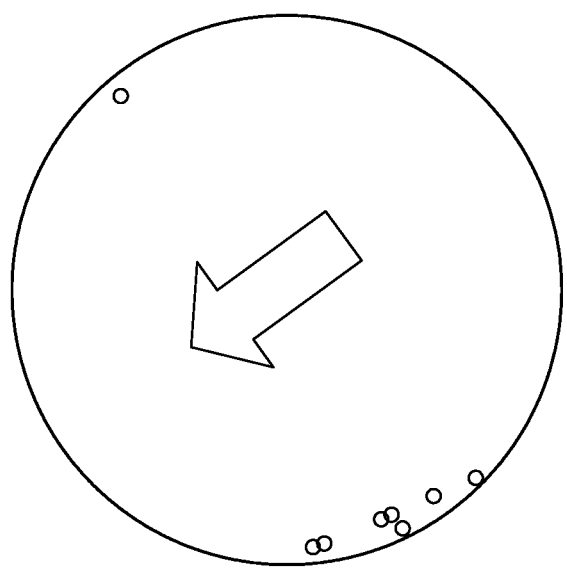
FIG. 2B is an LPD map of the wafer surface after cleaning in the case when using the conventional method for cleaning the semiconductor wafer, and the arrow in the drawing illustrates the immersion direction of the semiconductor wafer.

With reference to FIG. 1D, in the fourth step, the ozone water is resupplied into the cleaning tank 1 from the lower part of the cleaning tank 1 while making the ozone water overflow again from the upper part of the cleaning tank 1 to outside the cleaning tank 1. At this time, the rising flow of the ozone water is produced in the cleaning tank 1 from the lower part toward the upper part of it. However, even if the particles are separated and diffuse due to the rising flow of the ozone water, the oxide film has formed on the wafer surface after the third step, thus, the diffused particles adhere not on the active surface but on the oxide film. Accordingly, when the oxide film is removed in a subsequent hydrofluoric acid cleaning, the particles on the oxide film are also removed simultaneously. In the fourth step, the ozone water in the cleaning tank 1 is always replaced with new ozone water in the same manner as the first step, and the ozone concentration is held constant. It should be noted that the fourth step can be performed simultaneously with the first step.

The period of time from when the entirety of the semiconductor wafer W is immersed into the ozone water stored in the cleaning tank 1 in the third step illustrated in FIG. 1C until the ozone water is resupplied in the fourth step illustrated in FIG. 1D is preferably set to 1 second or more to 10 seconds or less. If the period of time is 1 second or more, the oxide film is sufficiently formed on the main surface of the semiconductor wafer due to the oxidation action of the ozone water. Accordingly, even if the rising flow of the ozone water is produced in the fourth step, the particles adhered to an edge part of the wafer can be suppressed from firmly adhering to the main surface of the wafer. If the period of time is 10 seconds or less, even if the supply of the ozone water is stopped, the decomposition of the ozone contained in the ozone water does not occur to a great extent, thus, the detergency of the ozone water can be sufficiently maintained. More preferably, this period of time is set to 1 second or more to 5 seconds or less.

The period of time from when the supply of the ozone water was stopped in the second step illustrated in FIG. 1B until the ozone water is resupplied in the fourth step illustrated in FIG. 1D is preferably set to 1 second or more to 30 seconds or less. If the period of time is 1 second or more, the time for lowering the semiconductor wafer W in the third step can be sufficiently maintained. If the period of time is 30 second or less, even if the supply of the ozone water was stopped, the decomposition of the ozone contained in the ozone water does not occur to a great extent, thus, the detergency of the ozone water can be sufficiently maintained. More preferably, this time is set to 1 second or more to 10 seconds or more and still more preferably, 1 second or more to 5 seconds or less.

[Semiconductor Wafer]

The semiconductor wafer which can be used in the present embodiment is not specifically limited, as long as it is a semiconductor wafer such as a silicon wafer which is generally subjected to ozone cleaning. However, from the viewpoint of more prominently obtaining the effect of the present embodiment, the semiconductor wafer is preferably an epitaxial silicon wafer in which a silicon epitaxial layer is formed on a silicon wafer, or is a silicon annealed wafer in which a silicon wafer is subjected to the annealing process in a reducing atmosphere or an inert gas atmosphere. This is because the main surface of these semiconductor wafers is an active surface (hydrophobic surface).

Above, the method for cleaning the semiconductor wafer of the present disclosure has been described based on the present embodiment. However, the present disclosure is not limited thereto, and appropriate modifications may be made thereto within the scope of the claims.

[Manufacturing Method of the Semiconductor Wafer]

In the present disclosure, the above-mentioned method for cleaning the semiconductor wafer can be used in the step of manufacturing the semiconductor wafer.

The manufacturing method of the semiconductor wafer according to the present embodiment can comprise transferring (transfer between processes) the semiconductor wafer, subsequently, using the above-mentioned method for cleaning the semiconductor wafer to clean it, subsequently, performing an SC1 cleaning, or a cleaning, the main purpose of which is to remove particles, such as brush scrub cleaning, and subsequently, performing an SC2 cleaning and a Diluted Hydrofluoric acid (DHF) rinse, or repeating the hydrofluoric acid cleaning and ozone water cleaning, the main purpose of which is to remove a metal element, such as spin cleaning. It should be noted that even if the hydrofluoric acid cleaning and the ozone water cleaning are repeated and the aforementioned method for cleaning is applied to the spin cleaning, the wafer transfer only occurs in the cleaning device between the hydrofluoric acid cleaning tank to the ozone cleaning tank, thus, in the first place, the probability that the particles are generated is low, and hardly any deposits is present on the wafer surface.

Further, an epitaxial growth process may be performed to the semiconductor wafer prior to transferring the semiconductor wafer to the ozone cleaning tank, or, an annealing process may be performed in a reducing atmosphere or an inert gas atmosphere. In the epitaxial growth process, for example, a silicon epitaxial layer having a thickness of 1 to 20 μm can be grown by the CVD method using a semiconductor wafer as a silicon wafer and using dichlorosilane, trichlorosilane, etc. as source gases and a substrate temperature of 1000 to 1150° C. In this case, the main surface of the silicon epitaxial layer becomes the active surface (hydrophobic surface). Further, in the annealing process, a semiconductor wafer is used as a silicon wafer, and the silicon wafer is subjected to a heat treatment in a reducing atmosphere such as hydrogen or an inert gas atmosphere such as argon at 1150 to 1250° C., so that it is possible to reduce Grown-in defects (COP: Crystal Originated Particle) in a surface layer part (the region from 1 to 10 μm from the surface) of the silicon wafer. In this case, the main surface of the surface layer part side of the silicon wafer becomes the active surface (hydrophobic surface). If the semiconductor wafer having an active surface (hydrophobic surface) is transferred between processes, it is likely that the particles will adhere to the active surface. Accordingly, if the abovementioned method for cleaning is used, the deposits on the active surface can be more effectively suppressed. It should be noted that a natural oxide film may be grown on the main surface of the wafer after the epitaxial growth process or annealing process prior to the ozone cleaning, but even if the natural oxide film is formed, it is not changed to become an active surface (hydrophobic surface).

According to the present embodiment, the semiconductor wafer in which the deposits on the main surface of the wafer are effectively suppressed can be obtained.

Above, the method for cleaning the semiconductor wafer of the present disclosure has been described based on the present embodiment. However, the present disclosure is not limited thereto, and appropriate modifications may be made thereto within the scope of the claims.

EXAMPLES

Example

A silicon wafer having a 300 mm diameter obtained by cutting out a single crystal silicon ingot was subjected to an epitaxial growth process at a temperature of 1000° C. to 1150° C. to prepare 25 epitaxial silicon wafers. Note that, regarding the epitaxial growth conditions, the source gas was trichlorosilane, and the thickness of the silicon epitaxial layer was made to 2 μm. Moreover, each epitaxial silicon wafer was subjected to the method for cleaning illustrated in FIGS. 1A to 1D.

First, ozone water having an ozone concentration of 20 ppm generated by the ozone water generating unit was supplied in the cleaning tank from the pair of ozone water supply nozzles provided in the bottom part of the cleaning tank via the ozone water supply pipe while overflowing from the opening of the top part of the cleaning tank (first step). By regulating the regulation valve, the amount of ozone water supplied from the ozone water supply nozzle was set to 42000 mm$^3$/sec.

Next, by closing the regulation valve the supply of the ozone water to the cleaning tank was stopped (second step). Next, the abovementioned transfer robot was used to lower the epitaxial silicon wafer with regard to the cleaning tank at a speed of 190 mm/sec, so as to immerse the epitaxial silicon wafer in the ozone water in the cleaning tank (third step). The period of time from when the supply of the ozone water was stopped in the second step until the lower end of the wafer contacted the liquid surface of the ozone water in the third step was set to 1 second.

Next, the regulation valve was opened to resupply the ozone water in the cleaning tank from the ozone water supply nozzle while making the ozone water overflow again from the opening in the top part of the cleaning tank (fourth step). The period of time from when the entirety of the epitaxial silicon wafer was immersed into the ozone water in the third step until the ozone water was resupplied in the fourth step was set to 1 second. Further, the period of time from when the supply of the ozone water was stopped in the second step until the ozone water was resupplied in the fourth step was set to 4 seconds.

Comparative Example

In Comparative Example, in place of the second and the third steps in Example, each epitaxial silicon wafer was immersed into the ozone water in the cleaning tank in a state in which the ozone water was supplied to the cleaning tank from the lower part of the cleaning tank while the ozone water overflowed from the upper part of the cleaning tank. Except this, Comparative Example is the same as Example. Note that, the amount of ozone water supplied from the ozone water supply nozzle when the wafer was lowered was set to 60000 $mm^3$/sec.

(Evaluation Method)

Each of the 25 epitaxial silicon wafers prepared by each of Example and Comparative Example was subject to observation of the surface of the silicon epitaxial layer using a surface examination device (Surfscan SP-2 manufactured by KLA-Tencor) in Dark Field Composite Oblique Mode (DCO Mode), to examine the number of Light Point Defects (LPD) having a size of 45 nm or more. Table 1 shows the average value of the 25 wafers.

TABLE 1

|   | Number of LPD 45 nm or more (No/Wf) |
|---|---|
| Comparative Example | 2.19 |
| Example | 0.36 |

(Explanation of Evaluation Results)

As listed in Table 1, in Comparative Example, the epitaxial silicon wafer was immersed into the ozone water in a state in which the rising flow of the ozone water in the cleaning tank was not suppressed. Accordingly, numerous deposits remained on the surface of the silicon epitaxial layer, and thus, the LPD could not be suppressed. In contrast, in Example, the epitaxial silicon wafer was immersed into the ozone water in a state in which the rising flow of the ozone water was suppressed. Accordingly, the deposits on the surface of the silicon epitaxial layer could be effectively reduced, and the LPD could be effectively reduced.

INDUSTRIAL APPLICABILITY

According to the present disclosure, it is possible to effectively reduce deposits on the main surface of the wafer.

The invention claimed is:

1. A method for cleaning a semiconductor wafer in which the semiconductor wafer is immersed and cleaned in ozone water in a cleaning tank, the method comprising:
supplying the ozone water into the cleaning tank from a lower part of the cleaning tank with the ozone water overflowing from an upper part of the cleaning tank to outside of the cleaning tank;
subsequently, stopping a supply of the ozone water;
subsequently, immersing the semiconductor wafer into the ozone water in the cleaning tank; and
subsequently, resupplying the ozone water into the cleaning tank from the lower part of the cleaning tank with the ozone water overflowing again from the upper part of the cleaning tank to the outside of the cleaning tank;
wherein:
a period of time from when the supply of the ozone water is stopped until the ozone water is resupplied is set to 1 second or more to 30 seconds or less; and
a period of time from when the supply of the ozone water is stopped until a lower end of the semiconductor wafer contacts a liquid surface of the ozone water is set to 1 second or more to 10 seconds or less.

2. A method for cleaning a semiconductor wafer in which the semiconductor wafer is immersed and cleaned in ozone water in a cleaning tank, the method comprising:
supplying the ozone water into the cleaning tank from a lower part of the cleaning tank with the ozone water overflowing from an upper part of the cleaning tank to outside of the cleaning tank;
subsequently, stopping a supply of the ozone water;
subsequently, immersing the semiconductor wafer into the ozone water in the cleaning tank; and
subsequently, resupplying the ozone water into the cleaning tank from the lower part of the cleaning tank with the ozone water overflowing again from the upper part of the cleaning tank to the outside of the cleaning tank;
wherein:
a period of time from when the supply of the ozone water is stopped until the ozone water is resupplied is set to 1 second or more to 30 seconds or less; and
a period of time from when the entirety of the semiconductor wafer is immersed into the ozone water until the ozone water is resupplied is set to 1 second or more to 10 seconds or less.

3. The method for cleaning the semiconductor wafer according to claim 1, wherein prior to the cleaning, the semiconductor wafer is subjected to an epitaxial growth process.

4. The method for cleaning the semiconductor wafer according to claim 1, wherein prior to the cleaning, the semiconductor wafer is subjected to an annealing process in a reducing atmosphere or an inert gas atmosphere.

5. The method for cleaning the semiconductor wafer according to claim 1, wherein the semiconductor wafer is a silicon wafer.

6. A method of manufacturing a semiconductor wafer comprising the method according to claim 1.

7. The method for cleaning the semiconductor wafer according to claim 2, wherein prior to the cleaning, the semiconductor wafer is subjected to an epitaxial growth process.

8. The method for cleaning the semiconductor wafer according to claim 2, wherein prior to the cleaning, the semiconductor wafer is subjected to an annealing process in a reducing atmosphere or an inert gas atmosphere.

9. The method for cleaning the semiconductor wafer according to claim 2, wherein the semiconductor wafer is a silicon wafer.

10. A method of manufacturing a semiconductor wafer comprising the method according to claim 2.

* * * * *

UNITED STATES PATENT AND TRADEMARK OFFICE
CERTIFICATE OF CORRECTION

PATENT NO. : 11,114,317 B2
APPLICATION NO. : 16/441636
DATED : September 7, 2021
INVENTOR(S) : Wakasugi Page 1 of 1

It is certified that error appears in the above-identified patent and that said Letters Patent is hereby corrected as shown below:

In the Claims

At Column 10, Line 53 (Claim 7), please change "water" to -- wafer --.

Signed and Sealed this
Eighth Day of March, 2022

Drew Hirshfeld
*Performing the Functions and Duties of the
Under Secretary of Commerce for Intellectual Property and
Director of the United States Patent and Trademark Office*